United States Patent [19]

Moore

[11] Patent Number: 5,985,700
[45] Date of Patent: Nov. 16, 1999

[54] TFT FABRICATION ON LEACHED GLASS SURFACE

[75] Inventor: Chad B. Moore, Corning, N.Y.

[73] Assignee: Corning Incorporated, Corning, N.Y.

[21] Appl. No.: 08/756,844

[22] Filed: Nov. 26, 1996

[51] Int. Cl.$^6$ .............................. H01L 21/36; H01L 21/84
[52] U.S. Cl. ........................ 438/149; 438/164; 438/482; 438/488; 438/479
[58] Field of Search ................................ 438/149, 164, 438/482, 488, 479, FOR 155; 65/31

[56] References Cited

U.S. PATENT DOCUMENTS

| | | | |
|---|---|---|---|
| 4,485,146 | 11/1984 | Mizuhashi et al. | 428/428 |
| 4,983,370 | 1/1991 | Loritsch et al. | 423/340 |
| 5,093,196 | 3/1992 | Hecq et al. | 428/410 |
| 5,254,480 | 10/1993 | Tran . | |
| 5,292,354 | 3/1994 | Hecq et al. | 65/31 |
| 5,372,860 | 12/1994 | Fehlner et al. | 427/578 |
| 5,525,527 | 6/1996 | Tran . | |
| 5,583,369 | 12/1996 | Yamazaki et al. | 257/635 |
| 5,725,625 | 3/1998 | Kitayama et al. | 65/31 |
| 5,792,327 | 8/1998 | Belscher et al. | 204/192.15 |
| 5,818,053 | 10/1998 | Tran | 250/370.09 |
| 5,851,366 | 12/1998 | Belscher et al. | 204/192.26 |

FOREIGN PATENT DOCUMENTS

| | | |
|---|---|---|
| 0 468 759 A1 | 7/1991 | European Pat. Off. . |
| 58-053824 | 3/1983 | Japan . |
| 4-3496515 | 12/1992 | Japan . |

OTHER PUBLICATIONS

C.B. Moore, D.M. Trotter, F.P. Fehlner, "Barrier Layers for Poly–Si TFT Displays", Society for Information Display International Symposium Digest of Technical Papers, vol. 27, May 12–17, 1996.

R.J. Araujo, F.P. Fehlner, "Sodium Redistribution Between Oxide Phases", Journal of Non–Crystalline Solids, vol. 197 (1996) pp. 154–163.

*Primary Examiner*—Mary Wilczewski
*Attorney, Agent, or Firm*—Robert L. Carlson; Maurice M. Klee

[57] ABSTRACT

A method for forming top gated TFTs directly on a glass surface, wherein the glass surface is first leached adequately to provide a silica-rich boundary area at the glass surface, after which the source-drain semiconductor region is deposited directly onto the glass surface without a barrier layer.

21 Claims, 3 Drawing Sheets

TFT FABRICATION ON LEACHED GLASS SURFACE

FIELD OF THE INVENTION

The present invention relates to forming thin-film-transistors (TFT) on glass, more particularly to forming top gated TFT's directly on leached glass surfaces.

BACKGROUND OF THE INVENTION

Silicon finds wide application in electronic device production. One particular utility is thin film transistors (TFTs). Such transistors are critical components in numerous devices. A device of great interest currently is a liquid crystal display (LCD).

It is a goal of the silicon device industry, and especially active matrix liquid crystal device (AMLCD) production, to achieve higher performance by replacing amorphous silicon (a-Si) thin film transistors (TFTs) with a polycrystalline silicon (poly-Si) version. This change would result in higher on-currents, better frequency response, larger displays, and potentially longer life-times. It would be possible to implement peripheral circuitry, as well as pixel switches, on the glass substrate. This would greatly reduce the number of external connections to the substrate, thus increasing reliability and reducing cost.

Poly-Si TFTs are very attractive for the above reasons. The poly-Si film required for TFT fabrication can be formed directly on a flat glass substrate with a high strain point, such as Corning Code 1737 glass. However, these poly-Si TFTs are typically fabricated on glass substrates having an intermediate $SiO_2$ barrier layer deposited thereon between the base poly-Si layer and the glass substrate. This $SiO_2$ barrier coating is usually between 0.5 and 1 $\mu$m thick. The reason that a $SiO_2$ barrier layer is used is two fold. First the layer serves to separate the glass components, such as Al and B, from the active poly-Si base layer. This separation is critical because Al and B act as dopants in Si and would create a conductive back surface, hence increasing the leakage current of the transistor. The second use of the barrier layer is to prevent alkali diffusion out of the glass and into the subsequent device electronics. Such barrier layers are discussed, for example, in "Sodium Redistribution Between Oxide Phases", Araujo and Fehiner, J. Non-Crystalline Solids, Vol. 197, pp. 154–163, and "Barrier Layers for Poly-Si TFT Displays", Moore et al., SID 96 DIGEST, pp. 543–545 (1996). These articles indicate that by placing an $SiO_2$ barrier layer on an aluminoborosilicate glass the sodium redistribution will go against a concentration gradient. The sodium will tend to migrate from the low Na $SiO_2$ barrier layer into a higher Na concentration glass substrate.

One challenge to using poly-Si TFTs for active matrix pixel transistors is that poly-Si TFTs usually have higher currents in the off-state (leakage current) than do a-Si TFTs. Therefore, to address the active matrix display without losing contrast, the pixel TFTs should preferably have leakage currents less than $1\times10^{-10}$ amps. It would be desirable to eliminate the $SiO_2$ deposition process, and be able to deposit the TFT film directly onto the glass surface. However, as indicated in the "barrier layers" article, such attempts have heretofore resulted in unacceptable leakage currents.

SUMMARY OF THE INVENTION

In the present invention, a semiconductor substrate that does not require a deposited barrier layer is created by leaching the glass surface. Applicants have found that, by appropriate leaching of the glass surface, a silica rich barrier layer can be imparted to the glass surface without harming the surface roughness and other properties important to TFT fabrication.

An example of a suitable leaching process is the process typically known as an RCA clean. An RCA clean, commonly used in the semiconductor industry, employs warm (75° C.) baths of $NH_4OH/H_2O_2/H_2O$ and $HCl/H_2O_2/H_2O$, along with high-resistivity deionized water rinses. Substrates are cleaned with this technique to remove particles, organic residues, and metals, resulting in higher process yields. An RCA clean has little or no effect on $SiO_2$ films. In contrast, aluminoborosilicate glass substrates such as Corning code 1737 are leached during such a cleaning process. Inductively coupled plasma (ICP) and Secondary Ion Mass Spectroscopy (SIMS) analyses indicate that the chemical baths remove some of the aluminum, boron, sodium, calcium, barium, and other components, leaving behind a silica-rich surface layer. The resultant poly-Si TFT properties indicate that an appropriately leached surface layer can operate comparable to a deposited barrier layer such as the APCVD $SiO_2$ studied previously.

Using the methods of the present invention, thin film transistors can be formed whose leakage current or current in the off state, is at least an order of magnitude lower (more preferably at least 1.5, and most preferably at least 2 orders of magnitude lower) than the leakage current would be if the same thin film transistor had been deposited on an unleached sheet of said glass. By definition the leakage current is the minimum source-drain current at a given gate voltage. The leakage current of the TFTs in an AMLCD is preferred to preside at a gate voltage of 0 V. The active region in a TFT is the semiconductor region between the source and drain contacts directly under the gate. In a top-gated polysilicon TFT this active region is in intimate contact with the substrate.

The invention is particularly useful for forming polysilicon TFTs directly onto the glass substrate, without the use of a deposited barrier layer coating. For such polysilicon TFT's, by using the methods of the present invention, leakage currents can be made to be less than $10^{-10}$ amps at a source-drain voltage of 10 V, more preferably less than $10^{-11}$ amps, and most preferably less than $10^{-12}$ amps, with threshold voltages in each case less than 3 volts. The method of depositing the polysilicon coating in such embodiments is not critical, and thus the polysilicon can be deposited directly, or deposited as amorphous silicon and converted by appropriate crystallization processes which are known in the art. Alternatively, poly-Si may be deposited by laser or ion bombardment or deposited in a mixed amorphous Si/poly-Si phase and recrystallized.

DETAILED DESCRIPTION OF THE INVENTION

Figure 1:
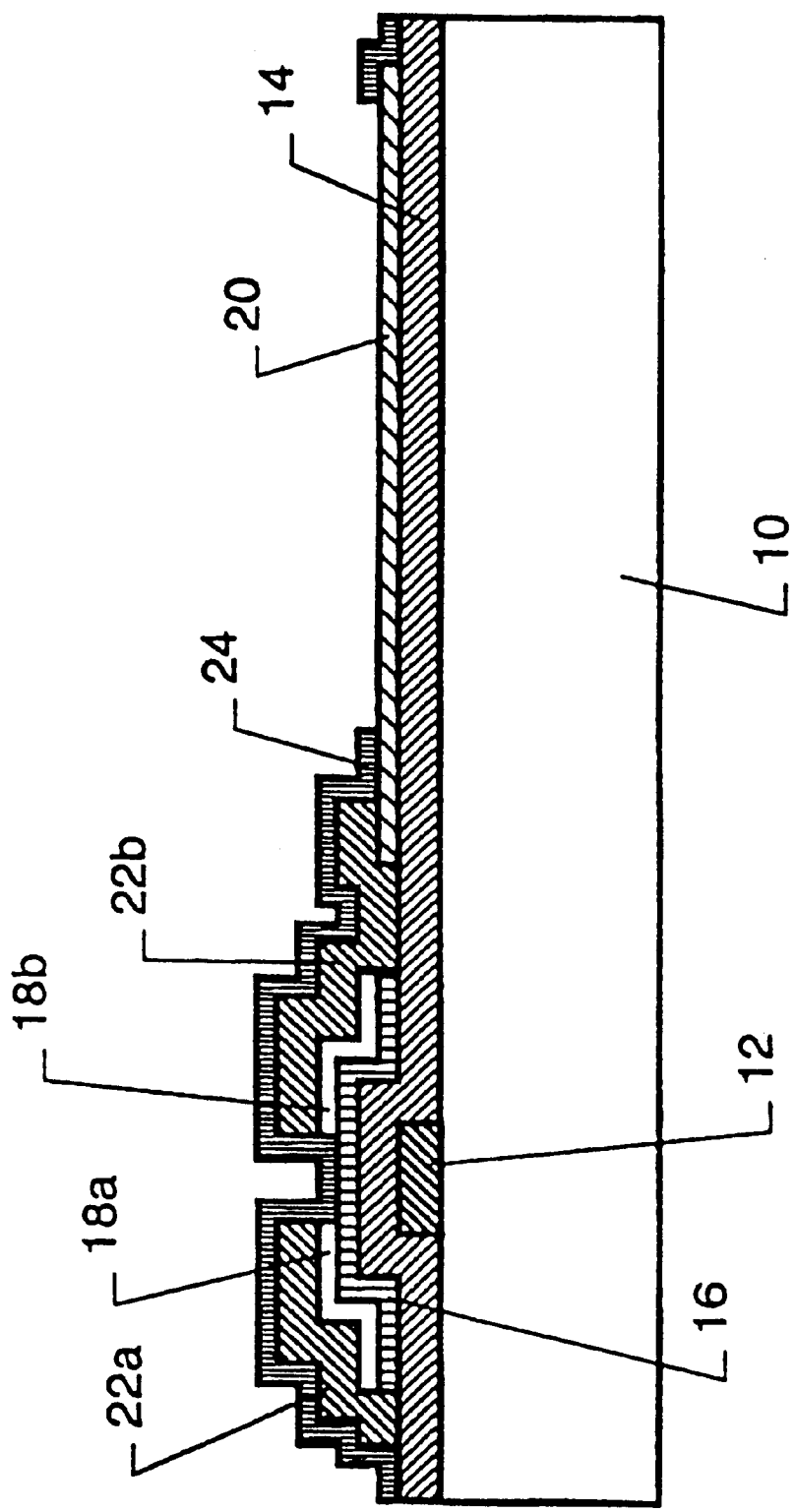
FIG. 1 illustrates a bottom gate TFT, such as is typically used to fabricate a-Si TFTs.
Figure 2:
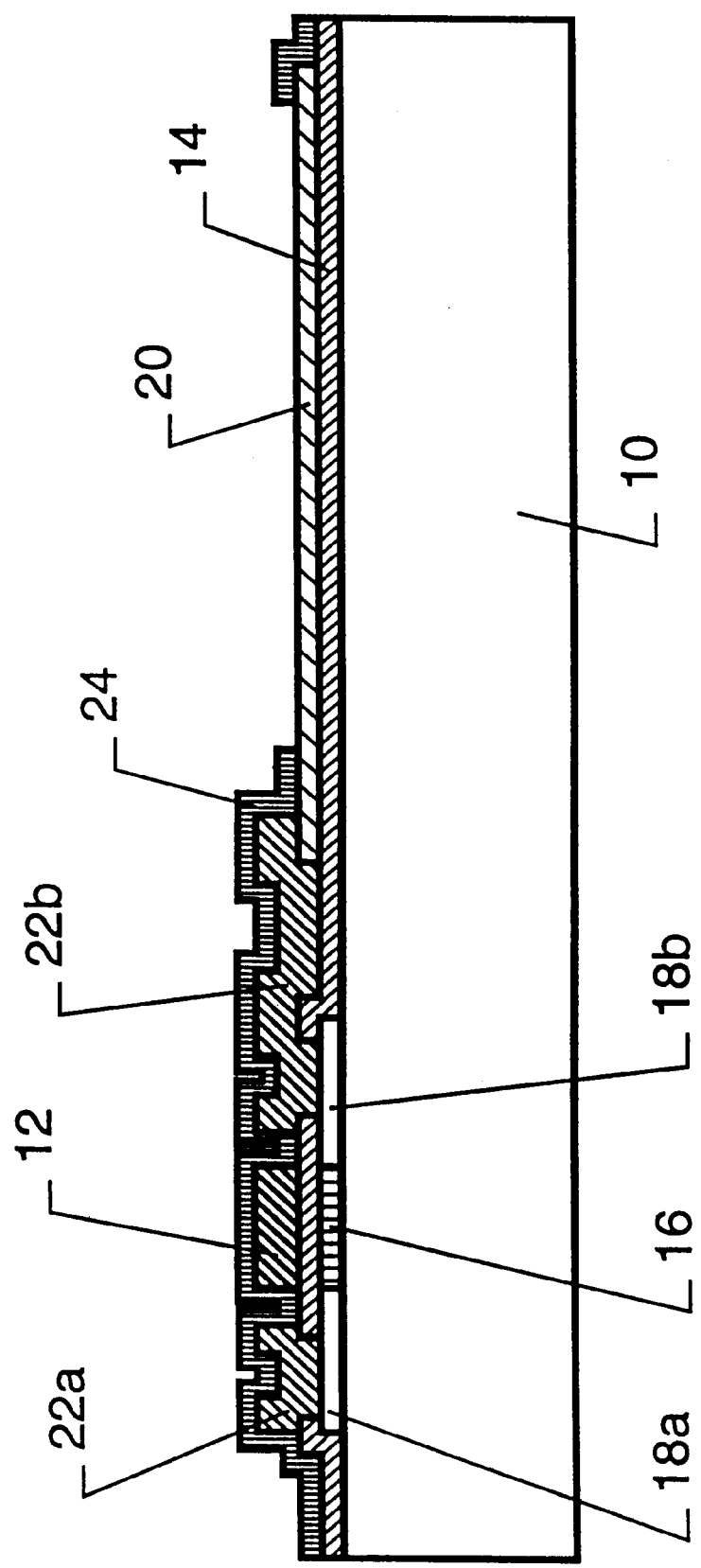
FIG. 2 illustrates a top gate TFT, such as is typically used to fabricate poly-Si TFTs.

FIG. 1 illustrates a bottom gate (a-Si) TFT. FIG. 2 illustrates a top gate (poly-Si) TFT. In the bottom gate a-Si TFT structure, the active semiconductor region is shielded from the glass substrate by the gate insulator, whereas, in the poly-Si top gate TFT structure this region is in intimate contact with the glass substrate. By top gate, it is meant that the gate metal is on top, and the source-drain semiconductor region is in contact with the substrate.

Referring to FIG. 1, the a-Si TFT consists of a glass substrate 10 on which a metal gate material 12 (e.g. Ta, Mo) is deposited, patterned and etched. A gate dielectric 14 (typically SiN for a-Si TFTs) is deposited over the entire surface which includes the glass 10 and gate metal 12. Next an intrinsic (undoped) silicon layer 16 is deposited and patterned, after which n-doped silicon layers 18a (source) and 18b (drain) are selectively deposited. ITO pixel layer 20 is deposited over the gate oxide 14 and patterned in the pixel region. Metal source lines 22a and the connector 22b between drain 18b and ITO pixel 20 are deposited and patterned. The device is completed by deposition of a passivation layer 24 (e.g. SiN or $SiO_2$). Note that in this bottom gate TFT structure the active region of the TFT 16 is separated from the glass substrate 10 by the gate dielectric 14.

A typical poly-Si top gate TFT, illustrated in FIG. 2, has relatively similar layers. However, in the top gate TFT, the active source drain semiconductor region, which consists of intrinsic silicon 16, is in direct contact with the glass substrate. It is the top gate TFT that the present invention is primarily concerned with. Prior to the present invention, glass substrate 10 in such devices employed a deposited barrier layer thereon (e.g. 0.5 micron to 1 micron thick $SiO_2$) which was sufficient to prevent migration of components from the glass into the TFT.

Using the methods of the present invention, it is possible to deposit silicon coatings directly onto the leached glass surface, without having to first deposit a barrier layer coating on the glass. However, the surface roughness of the glass is not adversely affected by the leaching step, and in fact does not increase the surface roughness of the substrate more than 500 angstroms RMS over a 5 micron by 5 micron area. More preferably, the increase surface roughness is less than 200 angstroms RMS over a 5 micron by 5 micron area and most preferably the increase surface roughness is less than 100 angstroms RMS over a 5 micron by 5 micron area.

The leaching preferably is done using a liquid or gas having a pH between 0–6 and/or 8–14, or combinations thereof, and which preferably is capable of removing metal constituents from the glass surface. In one embodiment, the leaching is performed using a base having a pH between 8–14, followed by contact with an acid having a pH between 0–6. A preferred method of leaching the glass involves contact of the glass surface with leaching materials such as are used in portions of what is known as the RCA clean. The first step of an RCA clean involves a base clean using 4 parts $H_2O$, 1 part $NH_4OH$ and 1 part $H_2O_2$. The purpose of the base clean is to remove organic materials. The base clean is typically followed by an $H_2O$ rinse. The second step of an RCA clean involves an acid clean consisting of 12 parts $H_2O$, 2.5 parts HCl and 2.5 parts $H_2O_2$. The purpose of the acid clean is to remove metals. The acid clean is typically followed by an $H_2O$ rinse and then a quick HF dip, usually 100:1, followed by another $H_2O$ rinse and a spin dry.

Leaching experiments show that, during the base clean portion of the RCA clean, a very high concentration of aluminum is leached out of the glass surface. The leaching experiments were performed using Inductively Coupled Plasma (ICP) analysis of the chemical baths and by studying the cross-contamination onto a poly-Si coated substrate using Secondary Ion Mass Spectroscopy (SIMS). Other glass components such as calcium were also leached out of the glass surface, however, not nearly in as high a concentration as the aluminum. The acid part of the RCA clean also leaches calcium and barium and removes any aluminum left behind from the base clean.

Figure 3:
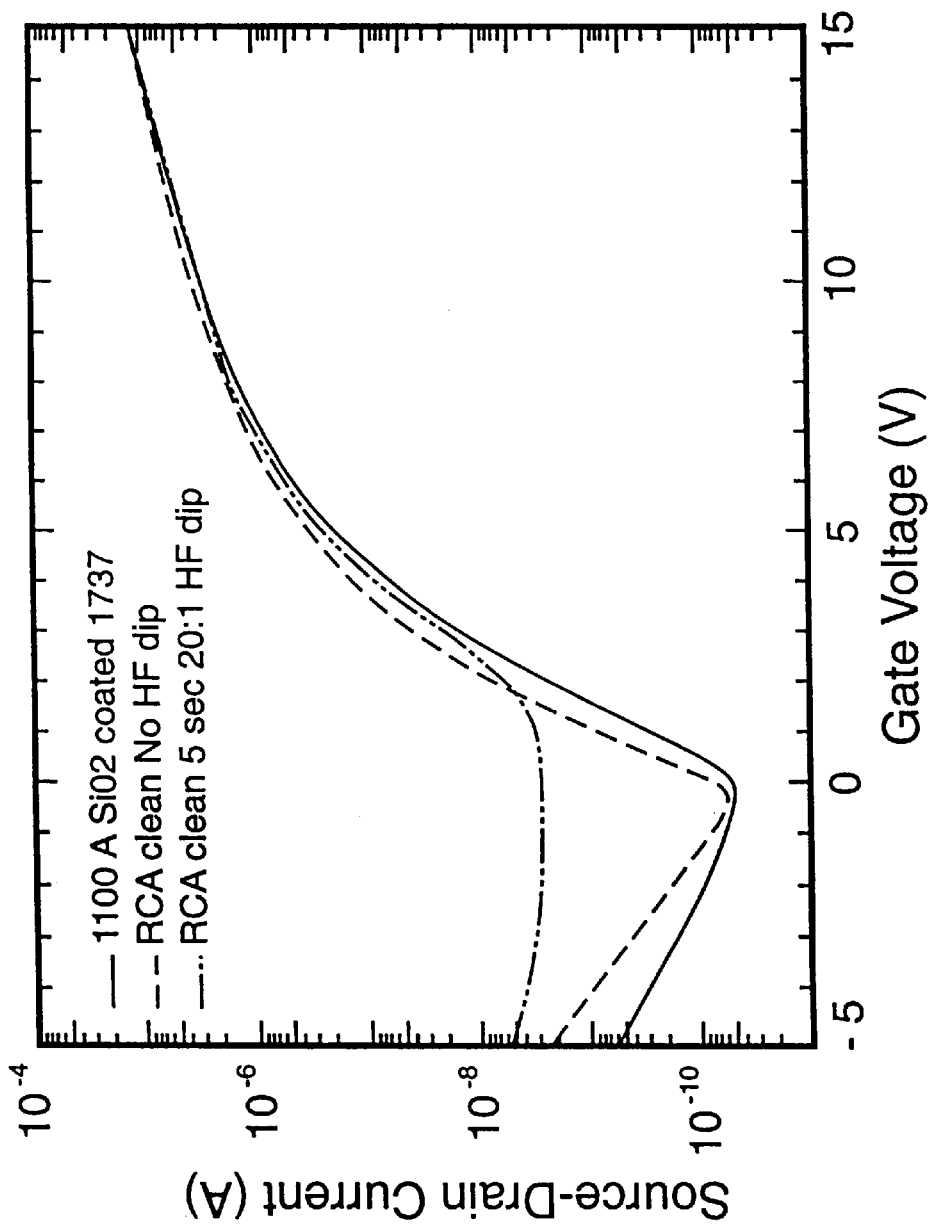
FIG. 3 illustrates comparative current versus voltage characteristics of prior art transistors and those made in accordance with the present invention.

A low temperature (~600° C.) TFT fabrication process was used to make top gate polysilicon TFTs similar to that illustrated in FIG. 2 on three different substrates. In each of these TFTs, the polysilicon was deposited directly using low pressure CVD from a silane. The first substrate was Corning Code 1737 with a 1100 angstrom atmospheric pressure chemical vapor deposited (APCVD) $SiO_2$ barrier coat thereon. The other two substrates were uncoated Code 1737 glass substrates both with and without an HF dip. Source-drain current versus applied voltage characteristics of transistors made on each of these three substrates were conducted, and the results are illustrated in FIG. 3.

Note that TFTs fabricated on substrates which were appropriately leached using an RCA clean with no HF dip exhibited a leakage current lower than the $SiO_2$ barrier coated glass substrates. During the early days of transistor fabrication the RCA cleaning of the glass substrate before the base poly-Si layer deposition included a short dilute HF dip as the last step in the cleaning process. Using this type of cleaning process, transistors fabricated on the bare glass substrates exhibited a leakage current which was about two orders of magnitude higher than those fabricated on 1100 Å thick APCVD $SiO_2$. This short HF etch at the end of the RCA cleaning process is standard in the semiconductor industry to remove the native oxide from a crystalline silicon wafer. However, when performed on a glass surface it removes the leached glass layer produced by the base clean step.

Therefore, when the short dilute HF dip at the end of the RCA clean was eliminated, the leakage current of the transistors turned out to be statistically lower than (better) those fabricated on $SiO_2$ coated glass substrates. The reason proposed for this phenomena is that the RCA clean creates a leached silica rich surface layer, which serves as a barrier between the bulk of the glass substrate and the subsequent electronic films.

The invention is further illustrated by the following example, which is meant to be illustrative and not limiting.

EXAMPLE

Three different types of substrates were prepared for top gate TFT fabrication as follows: 1) Substrates cleaned in the standard RCA clean for 10 minutes in both the base and the acid baths plus a dilute HF dip to remove the leached surface layer, 2) Substrates cleaned in the standard RCA clean for 10 minutes in both the base and the acid baths to create a thin leached surface layer, and 3) Substrates cleaned in the standard RCA clean for 120 minutes in both the base and the acid baths to create a heavily leached surface layer. Both p-type and n-type TFTs were fabricated on these substrates. A matrix of 121 identical top gate polysilicon TFTs similar to that illustrated in FIG. 2 were formed on each substrate. In each case, the polysilicon was deposited by low pressure CVD from a silane. A voltage of 10 V was then applied across source lines 22a and 22b and the metal gate 12 was swept from −5 to 15 volts and the current was measured between source lines 22a and 22b. The average and standard deviation of the measured leakage currents (minimum source-drain current) are shown in Table 1.

TABLE 1

Means and standard deviations of the leakage current of both n-type and p-type transistors on three different substrates.

| | n-type TFTs $I_{min}$ ($10^{-12}$ A) | p-type TFTs $I_{min}$ ($10^{-12}$ A) |
|---|---|---|
| 10 min RCA + HF | 52 ± 3.5 | 360 ± 84 |
| 10 min RCA | 7.3 ± 1.9 | 8.6 ± 1.5 |
| 120 min RCA | 5.4 ± 2.6 | 8.4 ± 2.6 |

These examples demonstrate that the leakage current follows the same trends previously observed in the I–V curves shown in FIG. 3. Note that for the n-type TFTs, the resultant leakage current is approaching $10^{-12}$ amps. It is believed that, if higher quality silicon (such as, for example, laser recrystallized polysilicon or solid phase crystallized polysilicon) was employed, the leakage currents for these samples would have been less than $10^{-12}$ amps. Transistors fabricated on surfaces that had an HF dip to remove the created leached surface had substantially higher leakage currents than those TFTs on leached or silica rich surfaces. A trend is also observed in the amount of leaching or RCA treatment of the glass surface. The longer the surface is leached, the more pure the silica-rich surface boundary area becomes and the thicker the leached layer becomes which, in turn, yields transistors with even lower leakage currents. Little if any difference was observed in the surface roughness of the glass during the leaching process of the RCA clean. The initial RMS surface roughness of the Corning code 1737 glass was about 2.0 angstroms in a 4 $\mu$m×4 $\mu$m area. After the standard 10 minute RCA clean with no HF dip the RMS surface roughness was measured to be 1.7 to 2.2 $\mu$m.

Although the invention has been described in detail for the purpose of illustration, it is understood that such detail is solely for that purpose and variations can be made therein by those skilled in the art without departing from the spirit and scope of the invention which is defined by the following claims.

What is claimed is:

1. A method of making top gated thin film transistors directly onto glass substrates, the method comprising:

leaching the surface of the glass to form a leached glass surface;

forming a silicon coating directly onto said leached glass surface;

patterning said silicon coating to form the base of said thin film transistor; and continuing the fabrication steps necessary to fabricate said thin film transistor.

2. The method of claim 1, wherein source-drain semiconductor region in said thin film transistor is in direct contact with said leached glass surface.

3. The method of claim 1, wherein said leaching step comprises using a liquid or a gas having a pH between 0–6 and/or 8–14.

4. The method of claim 1, wherein said forming a silicon coating step comprises forming an amorphous silicon or polycrystalline silicon film which is in intimate contact with the leached glass surface.

5. The method of claim 1, wherein said leaching step causes a source-drain current at zero gate voltage for said TFT to be at least an order of magnitude lower than said source-drain current at zero gate voltage would be if said transistor were fabricated on an unleached glass substrate.

6. The method of claim 1, wherein said leaching step causes a source-drain current at zero gate voltage for said TFT to be at least 1.5 orders of magnitude lower than said source-drain current at zero gate voltage would be if said transistor were fabricated on an unleached glass substrate.

7. The method of claim 1, wherein said leaching step causes a source-drain current at zero gate voltage for said TFT to be at least 2 orders of magnitude lower than said source-drain current at zero gate voltage would be if said transistor were fabricated on an unleached glass substrate.

8. The method of claim 1, wherein the source-drain current of the TFT is less than $1\times10^{-10}$ amps when a gate voltage of zero volts and a source-drain voltage of 10 V is applied to the TFT.

9. The method of claim 8, wherein the threshold voltage of said TFT is less than 3 volts.

10. The method of claim 1, wherein the source-drain current of the TFT is less than $1\times10^{-11}$ amps when a gate voltage of zero volts and a source-drain voltage of 10 V is applied to the TFT, and the threshold voltage of said TFT is less than 3 volts.

11. The method of claim 1, wherein the source-drain current of the TFT is less than $1\times10^{-12}$ amps when a gate voltage of zero volts and a source-drain voltage of 10 V is applied to the TFT, and the threshold voltage of said TFT is less than 3 volts.

12. The method of claim 1, wherein said leached glass surface formed by said leaching step exhibits an increased surface roughness, compared to that present prior to said leaching step, of less than 500 angstroms RMS over a 5 $\mu$m×5 $\mu$m area.

13. The method of claim 1, wherein said leached glass surface formed by said leaching step exhibits an increased surface roughness, compared to that present prior to said leaching step, of less than 200 angstroms RMS over a 5 $\mu$m×5 $\mu$m area.

14. The method of claim 1, wherein said leached glass surface formed by said leaching step exhibits an increased surface roughness, compared to that present prior to said leaching step, of less than 100 angstroms RMS over a 5 $\mu$m×5 $\mu$m area.

15. The method of claim 3, wherein the source-drain current of the TFT is less than $1\times10^{-10}$ amps when a gate voltage of zero volts and a source-drain voltage of 10 V is applied to the TFT.

16. The method of claim 15, wherein the threshold voltage of said TFT is less than 3 volts.

17. The method of claim 3, wherein the source-drain current of the TFT is less than $1\times10^{-11}$ amps when a gate voltage of zero volts and a source-drain voltage of 10 V is applied to the TFT, and the threshold voltage of said TFT is less than 3 volts.

18. The method of claim 16, wherein said leached glass surface formed by said leaching step exhibits an increased surface roughness, compared to that present prior to said leaching step, of less than 500 angstroms RMS over a 5 $\mu$m×5 $\mu$m area.

19. A method of making thin film transistors on glass substrates, the method comprising:

leaching the surface of the glass to form a leached glass surface;

forming a silicon coating directly onto said leached glass surface;

patterning said silicon coating to form the base of said thin film transistor; and continuing the fabrication steps necessary to fabricate said thin film transistor, whereby said forming, patterning, and continuing fabrication steps result in the formation of a TFT having its source-drain semiconductor region in direct contact with said leached glass surface.

20. The method of claim 19, wherein said leaching step causes a source-drain current at zero gate voltage for said TFT to be at least an order of magnitude lower than said source-drain current at zero gate voltage would be if said transistor were fabricated on an unleached glass substrate.

21. The method of claim 19, wherein the source-drain current of the TFT is less than $1 \times 10^{-10}$ amps when a gate voltage of zero volts and a source-drain voltage of 10 V is applied to the TFT.

* * * * *